(12) United States Patent
Jun et al.

(10) Patent No.: US 8,129,023 B2
(45) Date of Patent: *Mar. 6, 2012

(54) POLYMER PARTICLES, CONDUCTIVE PARTICLES, AND AN ANISOTROPIC CONDUCTIVE PACKAGING MATERIALS CONTAINING THE SAME

(75) Inventors: Jung Bae Jun, Gunpo-si (KR); Jin Gyu Park, Seoul (KR); Jae Ho Lee, Yongin-si (KR); Tae Sub Bae, Suwon-si (KR)

(73) Assignee: Cheil Industries Inc., Gumi-si (KR)

( * ) Notice: Subject to any disclaimer, the term of this patent is extended or adjusted under 35 U.S.C. 154(b) by 1085 days.

This patent is subject to a terminal disclaimer.

(21) Appl. No.: 11/763,521

(22) Filed: Jun. 15, 2007

(65) Prior Publication Data

US 2007/0252112 A1 Nov. 1, 2007

Related U.S. Application Data

(63) Continuation-in-part of application No. PCT/KR2005/002005, filed on Jun. 27, 2005.

(30) Foreign Application Priority Data

Dec. 16, 2004 (KR) .................. 10-2004-0107329

(51) Int. Cl.
   B32B 27/02 (2006.01)
   B32B 5/16 (2006.01)
   B05D 7/00 (2006.01)
   H01B 1/00 (2006.01)

(52) U.S. Cl. ........ 428/407; 428/402; 428/403; 252/500; 252/512; 427/216; 427/220; 427/221

(58) Field of Classification Search .................. 428/403, 428/407, 402; 252/500, 512; 427/216, 220, 427/221
   See application file for complete search history.

(56) References Cited

U.S. PATENT DOCUMENTS

| | | | |
|---|---|---|---|
| 4,790,551 A | | 12/1988 | Ukai et al. |
| 5,486,941 A | * | 1/1996 | Saiuchi et al. ............ 349/155 |
| 5,580,838 A | | 12/1996 | Patterson |
| 6,344,156 B1 | | 2/2002 | Yamada et al. |
| 6,770,369 B1 | | 8/2004 | Oyamada et al. |
| 7,291,393 B2 | * | 11/2007 | Wakiya et al. ............ 428/403 |
| 7,338,710 B2 | | 3/2008 | Kamiya et al. |
| 7,851,063 B2 | | 12/2010 | Jun et al. |
| 2001/0046021 A1 | | 11/2001 | Kozuka et al. |
| 2006/0263581 A1 | | 11/2006 | Park et al. |
| 2007/0145585 A1 | | 6/2007 | Jun et al. |

FOREIGN PATENT DOCUMENTS

| | | |
|---|---|---|
| EP | 1426979 A1 | 6/2004 |
| JP | 62-177082 | 8/1987 |
| JP | 63-107188 | 5/1988 |
| JP | 02-118079 A | 5/1990 |
| JP | 04-333025 A | 11/1992 |
| JP | 07-118617 | 5/1995 |
| JP | 07-118866 | 5/1995 |
| JP | 07-256231 A | 10/1995 |
| JP | 2507381 | 4/1996 |
| JP | 08-325543 | 12/1996 |
| JP | 09-185069 A | 7/1997 |
| JP | 11-125953 A | 5/1999 |
| JP | 2000-243132 | 9/2000 |
| JP | 2003-26813 | 1/2003 |
| JP | 2003-197028 | 7/2003 |
| JP | 2003-253231 | 9/2003 |
| JP | 2003-257247 | 9/2003 |
| JP | 2003-313304 B | 11/2003 |
| KR | 10-2005-0043639 | 5/2005 |
| WO | 92-06402 A | 12/1992 |

OTHER PUBLICATIONS

J. G. Park, et al. "Monodisperse polymer/metal composite particles by electroless chemical deposition: Effect of surface functionality of polymer particles", Journal of Applied Polymer Science, vol. 87, pp. 420-424, Jan. 18, 2003.
International Search Report for International Application No. PCT/KR2005/002005, mailed on Sep. 26, 2005.
English Translation of Abstract for Japanese Patent Application S63-107188.
International Search Report in commonly owned International Application No. PCT/KR2005/001558 dated Oct. 25, 2005.
Office Action in commonly owned U.S. Appl. No. 11/500,018 mailed on May 5, 2008, pp. 1-10.
Office Action in commonly owned U.S. Appl. No. 11/500,018 mailed on Nov. 6, 2008, pp. 1-9.
Office Action in commonly owned U.S. Appl. No. 11/500,018 mailed on May 13, 2009, pp. 1-8.
Office Action in commonly owned U.S. Appl. No. 11/500,018 mailed on Dec. 9, 2009, pp. 1-10.
Office Action in commonly owned U.S. Appl. No. 11/500,018 mailed on Nov. 23, 2010, pp. 1-8.

* cited by examiner

*Primary Examiner* — Michael M Bernshteyn
(74) *Attorney, Agent, or Firm* — Summa, Additon & Ashe, P.A.

(57) ABSTRACT

Disclosed herein are anisotropic conductive particles contained in anisotropic conductive adhesive films which can be used in circuit board mounting applications. The conductive particles have a uniform shape, a narrow particle diameter distribution, and appropriate compressive de-formability and recoverability from deformation. In addition, the conductive particles exhibit enhanced conducting properties without being ruptured when interposed and compressed between connection substrates, thereby achieving a sufficient contact area between the particles and the connection substrates. Further disclosed are polymer-based particles used in the conductive particles.

15 Claims, 1 Drawing Sheet

US 8,129,023 B2

POLYMER PARTICLES, CONDUCTIVE PARTICLES, AND AN ANISOTROPIC CONDUCTIVE PACKAGING MATERIALS CONTAINING THE SAME

CROSS REFERENCE TO RELATED APPLICATIONS

This non-provisional application is a continuation-in-part application of PCT Application No. PCT/KR2005/002005, filed Jun. 27, 2005, pending, which designates the U.S. and which is hereby incorporated by reference in its entirety, and from Korean Patent Application No. 10-2004-0107329, filed Dec. 16, 2004, which is also hereby incorporated in its entirety.

FIELD OF THE INVENTION

The present invention relates to conductive particles for use in conductive adhesives, anisotropic conductive adhesive films, conductive connection structures and the like for mounting circuit boards, and polymer particles used in the conductive particles.

BACKGROUND OF THE INVENTION

Anisotropic conductive connection can be required to electrically connect connection electrodes of an IC circuit board to terminals of a substrate mounted on a circuit board, such as a liquid crystal display (LCD) panel. Film-type adhesives are widely used as anisotropic conductive packaging materials, in which conductive particles, such as metal-coated resin particles or metal particles, are dispersed in an insulating resin, e.g., epoxy, urethane, or acrylic resin.

Conductive particles are interposed between electrodes and terminals by disposing the anisotropic conductive packaging material containing the conductive particles between the electrodes and the terminals and applying pressure and heat to adhere the packaging material therebetween. Currently, electrical connection occurs in the pressing direction, and an insulation state is maintained in a direction perpendicular to the pressing direction due to the presence of insulating components contained in an insulating adhesive.

In LCD packaging requiring anisotropic conductive connection, recent advances in LCD technologies have increased connection pitch compactness, IC bump minuteness and the number of leads printed on substrates. Further, there continues to be a need for improved electrical connection reliability. In order to satisfy such technical needs, conductive particles contained in anisotropic conductive films are largely required to have a uniform and small particle diameter. Further, it can be critical that conductive particles have enhanced conducting properties without being ruptured, together with appropriate compressive deformability and recoverability from deformation, because of increased contact area with connection substrates when the conductive particles are interposed and compressed between the connection substrates. Metal particles, such as nickel, gold and silver particles, and metal-coated base particles can be used as the conductive particles. However, since metal particles have a non-uniform shape and a much higher specific gravity than an adhesive resin, they can have poor dispersibility in the adhesive resin.

For these reasons, in mounting applications requiring superior connection of microelectrodes and improved connection reliability, conductive particles with a uniform shape, a relatively narrow particle diameter distribution and enhanced conducting properties are widely used as a plated layer formed on base polymer particles.

Extensive research has hitherto been conducted on conductive particles in which polymer particles are plated, and particularly on the characteristics of the particles after compressive deformation in terms of improved contact with electrodes and connection reliability.

For example, Japanese Patent Laid-open No. S63-107188 discloses the use of high-strength highly elastic conductive particles with a compressive strength of 500 kg/cm$^2$ and a high compressive elastic modulus of 80×10$^3$ kg/cm$^2$ or more. Further, PCT Publication WO 92/06402 discloses a spacer for a LCD and conductive particles using monodisperse resin particles as base particles. According to this publication, in order to readily control a gap between electrodes facing each other when the electrodes are connected to each other by compression using the conductive particles, the resin particles preferably have a compression hardness at 10% compressive deformation (10% K value) of 250 to 700 kgf/mm$^2$. In addition, in order to increase the contact area between the conductive particles and the electrodes after compression, the resin particles preferably have a recovery factor after compressive deformation of 30 to 80%.

Further, Japanese Patent Laid-open No. H07-256231 discloses conductive particles having a K value at 10% compressive deformation of 700 to 1,000 kgf/mm$^2$ and a recovery factor after compressive deformation of 65% to 95% at 20° C. in order to improve poor conductivity caused by changes in the temperature between electrodes, folding, mechanical impact, and the like.

Moreover, Japanese Patent Laid-open No. H1-125953 and No. 2003-313304 disclose conductive particles having a K value at 10% compressive deformation of 250 kgf/mm$^2$ or lower and a recovery factor after compressive deformation of 30% or greater for better connection reliability.

These patent publications note that as the recovery factor after compressive deformation of the conductive particles increases over a broad range of hardness, the conducting properties of the conductive particles, e.g., increased contact area with the electrodes, are enhanced.

However, when such conductive particles are dispersed in a cure-type binder resin and are pressed under heating to connect to electrodes, the adhesive force of the curing binder resin and the contact of the particles with the electrodes are often insufficient. Recently, fast curing processes of anisotropic conductive adhesive films at low temperatures within a short period of time have been increasingly employed. These short-term connection conditions enable rapid curing of a binder resin, but cause insufficient contact of conductive particles with electrodes.

In addition, in anisotropic conductive materials, e.g., connection films for chip on glass (COG), having a greatly increased content (by several tens of %) of conductive particles, a large amount of highly elastic conductive particles interposed between electrodes partly or wholly deteriorate the adhesion of the connection films, resulting in poor connection reliability over a long period of time.

In addition to minuteness of electrode patterns and compactness of connection pitches, low pressure processes are required to connect relatively weak wiring patterns, e.g., ITO electrodes to avoid damaging the wiring patterns. However, low pressure connection conditions can markedly deteriorate the adhesive force and connection reliability of highly elastic conductive particles.

SUMMARY OF THE INVENTION

The present invention can provide conductive particles having a substantially uniform shape, a narrow particle diameter distribution, and appropriate compressive de-formability and recoverability from deformation. The present invention can further provide conductive particles having enhanced conducting properties without being ruptured when interposed and compressed between connection substrates, thereby achieving sufficient contact area between the particles and the connection substrates.

The present invention can also provide polymer particles used in the conductive particles.

The present invention can further provide conductive particles having improved electrical connection reliability and anisotropic conductive packaging materials containing the conductive particles.

Polymer particles in accordance with the present invention can have a 10% K value (i.e. a K value at 10% particle diameter deformation) of about 250 to about 700 kgf/mm$^2$, a compression recovery factor of about 30% or less, and a compressive rupture deformation of about 30% or higher.

The 10% K value of the polymer particles can be in the range of about 350 to about 600 kgf/mm$^2$.

The 20% and 30% K values of the polymer particles can be no higher than about 70% of the 10% K value.

The polymer particles can have an average particle diameter of about 0.1 to about 200 μm, an aspect ratio lower than about 1.5, and a coefficient of variation (CV) not higher than about 20%.

The polymer particles can be made of a polymer resin including at least one crosslinking polymerizable monomer selected from the group consisting of: allyl compounds, e.g., divinylbenzene, 1,4-butanediol di(meth)acrylate, 1,6-hexanediol di(meth)acrylate, 1,9-nonanediol di(meth)acrylate, allyl (meth) acrylate, divinylsulfone, diallyl phthalate, diallylacrylamide, triallyl (iso)cyanurate, and triallyl trimellitate; (poly)alkylene glycol di(meth)acrylate, e.g., (poly)ethylene glycol di(meth)acrylate, and (poly)propylene glycol di(meth) acrylate; and pentaerythritol tetra(meth)acrylate, pentaerythritol tri(meth)acrylate, pentaerythritol di(meth)acrylate, trimethylolpropane tri(meth)acrylate, ditrimethylolpropane tetra (meth)acrylate, tetramethylolpropane tetra(meth)acrylate, dipentaerythritol hexa(meth)acrylate, dipentaerythritol penta (meth)acrylate, glycerol tri(meth) acrylate, and the like, and mixtures thereof.

The polymer particles can be prepared by copolymerizing at least one polymerizable unsaturated monomer selected from the group consisting of styrene-based monomers, e.g., styrene, ethyl vinyl benzene, α-methyl styrene, and m-chloromethyl styrene; acrylate-based monomers, e.g., methyl (meth)acrylate, ethyl(meth)acrylate, propyl(meth)acrylate, n-butyl(meth)acrylate, isobutyl(meth)acrylate, t-butyl(meth) acrylate, 2-ethylhexyl(meth)acrylate, n-octyl(meth)acrylate, lauryl(meth)acrylate, stearyl(meth)acrylate, ethylene glycol (meth)acrylate, and glycidyl (meth)acrylate; chlorovinyl, acrylic acid esters, acrylonitrile, vinyl acetate, vinyl propionate, vinyl butyrate, vinyl ether, allyl butyl ether, butadiene, isoprene, and the like and mixtures thereof.

The polymer particles can be prepared by seeded polymerization using polymer seed particles having a molecular weight of from about 1,000 to about 30,000.

In the seeded polymerization, the total content of the polymerizable monomers can be about 10 to about 300 parts by weight, based on one part by weight of the polymer seed particles.

The present invention also provides conductive particles including the polymer particles as base particles and at least one conductive metal layer formed on the surface of the polymer particles.

The conductive metal layer of the conductive particles can include at least one metal selected from the group consisting of nickel (Ni), gold (Au), silver (Ag), copper (Cu), platinum (Pt), palladium (Pd), cobalt (Co), tin (Sn), indium (In), indium tin oxide (ITO), and the like, and mixtures thereof. The conductive metal layer can have a thickness of about 0.01 μm to about 5 μm.

The conductive metal layer of the conductive particles can include at least one double layer selected from the group consisting of nickel/gold, nickel/platinum, and nickel/silver.

The present invention also provides an anisotropic conductive packaging material containing the conductive particles.

The conductive particles of the present invention can include the polymer particles as base particles of the conductive particles as described herein having a 10% K value (i.e. a K value at 10% particle diameter deformation) of about 250 to about 700 kgf/mm$^2$, a compression recovery factor of about 30% or less, and a compressive rupture deformation of about 30% or higher, wherein the 20% and 30% K values are about 70% or less of the 10% K value. Accordingly, the conductive particles of the present invention can have appropriate compressive deformability and recoverability. In addition, when the conductive particles are interposed between electrodes of a circuit board and the like, contact area can be increased while maintaining a uniform gap size. Thus the conductive particles of the invention can provide superior electrical connection and improved connection reliability.

BRIEF DESCRIPTION OF THE DRAWINGS

The above and other objects, features and other advantages of the present invention will be more clearly understood from the following detailed description taken in conjunction with the accompanying drawing, in which.

DETAILED DESCRIPTION OF THE INVENTION

Figure 1:
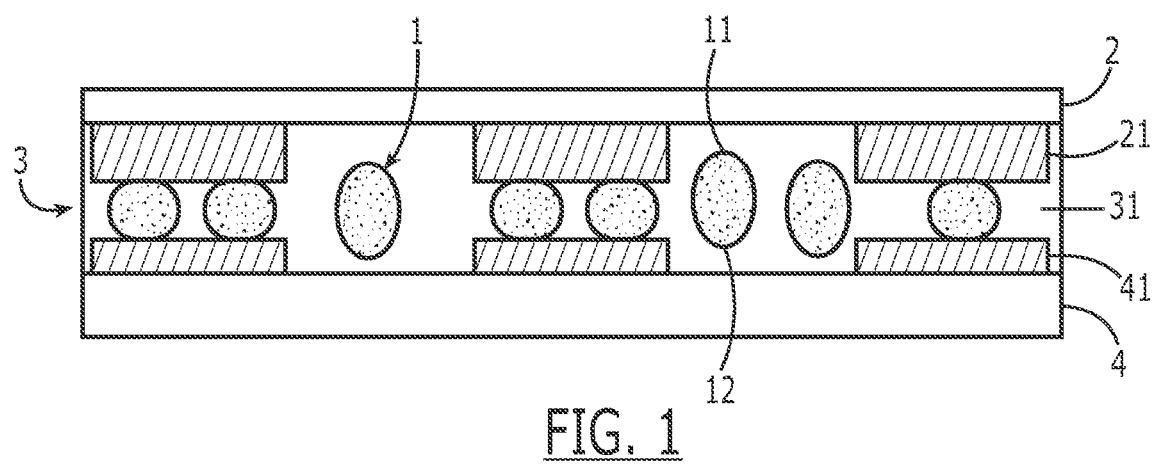
FIG. 1 is a cross-sectional view of an electrical connection structure of an anisotropic conductive film using conductive particles of the present invention.

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

The present invention can provide conductive particles including polymer particles and at least one metal layer coated on the surface of the polymer particles. The conductive particles of the present invention can be used in electrical connection structures of microelectrodes, anisotropic conductive adhesive films, and the like, in circuit board mounting applications.

To exhibit enhanced conducting properties when the polymer particles used in the conductive particles of the present invention are used in the above-mentioned electrical packaging materials, the polymer particles will have K values, recovery factor after compressive deformation, and compressive rupture deformation in optimum ranges.

K value is measured using a micro-compression tester (MCT-W series, manufactured by Shimadzu Corporation Ltd., Japan). Specifically, the K value is measured by fixing a single particle between a smooth upper pressure indenter (diameter: 50 μm) and a lower pressure plate, compressing the single particle at a compression speed of 0.2275 gf/sec and a maximum test load of 5 gf to obtain a load value and a compression displacement, and substituting the obtained values into the following Equation 1:

$$K = \left(\frac{3}{\sqrt{2}}\right) \cdot F \cdot S^{-\frac{3}{2}} \cdot R^{-\frac{1}{2}} \quad \text{Equation 1}$$

wherein F is a load value (kg) at x % compressive deformation, S is a compression displacement (mm) at x % compressive deformation, and R is a radius of the particles (mm).

As described above, the polymer particles can have a K value at 10% compressive deformation of about 250 to about 700 kgf/mm². The use of the polymer particles in the K value range defined above can enable the connection between facing electrodes in a constant gap size when interposed between the electrodes, without any damage to the electrodes. The 10% K value of the conductive particles can be in the range of about 350 to about 600 kgf/mm². When the 10% K value exceeds about 700 kgf/mm², the conductive particles interposed between the electrodes may not sufficiently deform to sufficiently increase contact area between the electrode surface and the conductive particles, making it difficult to lower connection resistance. Further, the polymer particles within the above range can be so hard that they may damage the electrode surface when the applied compressive force is increased for the purpose of lowering the connection resistance. On the other hand, when the 10% K value is lower than about 250 kgf/mm², excessive deformation can result from the applied pressure and thus the conductive layer may be peeled off from the particles, or excessive flatness can occur and thus the distance between the upper and lower electrodes is insufficiently ensured, which may result in poor adhesive force and connection reliability.

In general, the 10% K value universally and quantitatively represents the hardness of the particles, but the compressive deformability of the particles cannot be exactly evaluated by the 10% K value. Accordingly, K values at both 20% and 30% compressive deformation can simultaneously be taken into consideration.

FIG. 1 is a cross-sectional view of an electrical connection structure in which the conductive particles 1 of the present invention are dispersed in an anisotropic conductive film 3 and are interposed between respective electrodes of a circuit board 2 and a glass substrate 4. As shown in FIG. 1, in order to adhere the conductive particles 1 to the electrodes and to stably maximize the contact area between the conductive particles 1 and the electrodes after deformation while uniformly and sufficiently maintaining a constant gap between the conductive particles 1 and the electrodes, the particles 1 can be hard to some extent in the initial stage of compression and can be continuously deformed during compression.

Therefore, the 20% and 30% K values of the polymer particles 11 can be about 70% or less of the 10% K value, which is a representative value of initial hardness upon compression. The 20% and 30% K values of the particles can be maintained at about 60% or less of the 10% K value in terms of sufficient compressive deformability.

The compression recovery factor can be measured by obtaining the relationship between the applied loads and the compression displacements while compressing the particles to a peak load of 1.0 gf in a micro-compression tester and decompressing to an initial load of 0.1 gf. Specifically, the compression recovery factor of the particles can be defined as the ratio L2/L1 (%) wherein L1 is a displacement to the peak load upon loading and L2 is a displacement from the peak load to the initial load upon unloading. The loading and unloading can be carried out at a compression speed of 0.1517 gf/sec.

In the present invention, the compression recovery factor of the polymer particles 11 can be limited to about 30% or less, for example about 5% to about 30%, in terms of stabilized adhesion, maximized contact area with the electrodes, and improved connection reliability. If the recovery factor of the polymer particles 11 is close to zero, the difference between the elasticity of the particles and an adhesive resin based on changes in temperature can be excessively large, thus risking the danger of poor conducting properties. This limitation to the recoverability from deformation of the particles, although not general, can be very significant when the compressive deformability of the particles is taken into consideration along with the recoverability.

The compressive rupture deformation can be measured using the same micro-compression tester as in the measurement of K value. Specifically, the compressive rupture deformation of the particles can be defined as the ratio Ld/D (%) wherein Ld is a displacement at a time point when the particles are ruptured and D is a diameter of the particles. Since the conductive particles 1 of the present invention should not be easily ruptured by compression in order to achieve sufficient deformation and low connection resistance, the compressive rupture deformation of the polymer particles 11 can be limited to about 30% or greater, for example, the compressive rupture deformation of the polymer particles 11 can be about 40% or greater.

The polymer particles 11 of the present invention can have a particle diameter of about 0.1 to about 200 µm, for example about 1 to about 20 µm. When the particles have a particle diameter smaller than about 0.1 µm, they can aggregate. Meanwhile, when the particles have a particle diameter exceeding about 200 µm, they may not be of interest as materials for recent micromounting techniques.

The polymer particles 11 can have an aspect ratio of less than about 1.5 and a coefficient of variation (CV) in particle diameter of about 20% or less in order not to degrade the connection reliability. The aspect ratio used herein refers to a ratio of the longest axis to the shortest axis in the diameter of a single particle, and the CV value refers to a percentage (%) obtained by dividing the standard deviation of the particle diameter by the average particle diameter. The polymer particles can have an aspect ratio of less than about 1.3 and a CV value not greater than about 10%.

As mentioned herein, the conductive particles of the present invention can have a structure wherein a metal layer 12 is coated on the surface of the base polymer particles 11. Accordingly, the compressive deformability and compression recoverability of the conductive particles 1 are largely dependent on the base polymer particles 11 of the conductive particles.

The polymer resin-based particles 11 can include at least one material selected from the group consisting of polyolefins, such as but not limited to polyethylene, polypropylene, and the like, polyvinyl chloride, polystyrene, fluorinated polymers such as but not limited to polytetrafluoroethylene, polyesters, such as but not limited to polyethylene terephthalate, polybutylene terephthalate, and the like, polyamide, polyimide, polysulfone, polyphenylene oxide, polyacetal, urethane resin, unsaturated polyester resin, (meth)acrylate resin, styrene-based resin, butadiene resin, epoxy resin, phenol resin, and melamine resin, and the like and mixtures thereof.

Of these, styrene-based resin and (meth)acrylate resin can be advantageous, and polymer resins containing at least one crosslinking polymerizable monomer can also be advantageous.

The crosslinking polymerizable monomer can be selected from the group consisting of: allyl compounds, e.g., divinylbenzene, 1,4-butanediol di(meth)acrylate, 1,6-hexanediol di(meth)acrylate, 1,9-nonanediol di(meth)acrylate, allyl (meth)acrylate, divinylsulfone, diallyl phthalate, diallylacrylamide, triallyl (iso)cyanurate, and triallyl trimellitate; (poly) alkylene glycol di(meth)acrylate, e.g., (poly)ethylene glycol di(meth)acrylate, and (poly)propylene glycol di(meth)acrylate; and pentaerythritol tetra(meth)acrylate, pentaerythritol tri(meth)acrylate, pentaerythritol di(meth)acrylate, trimethylolpropane tri(meth)acrylate, ditrimethylolpropane tetra (meth)acrylate, tetramethylolpropane tetra(meth)acrylate, dipentaerythritol hexa(meth)acrylate, dipentaerythritol penta (meth)acrylate, and glycerol tri(meth)acrylate.

Polymerizable unsaturated monomers can be copolymerized with the crosslinking polymerizable monomers. Examples of polymerizable unsaturated monomers useful in the invention can include styrene-based monomers, e.g., ethyl vinyl benzene, styrene, α-methyl styrene, and m-chloromethyl styrene; acrylate-based monomers, e.g., methyl(meth) acrylate, ethyl(meth)acrylate, propyl(meth)acrylate, n-butyl (meth)acrylate, isobutyl(meth)acrylate, t-butyl(meth) acrylate, 2-ethylhexyl(meth)acrylate, n-octyl(meth)acrylate, lauryl(meth)acrylate, stearyl(meth)acrylate, ethylene glycol (meth)acrylate, and glycidyl (meth) acrylate; chlorovinyl, acrylic acid esters, acrylonitrile, vinyl acetate, vinyl propionate, vinyl butyrate, vinyl ether, allyl butyl ether, butadiene, and isoprene, and the like. These polymerizable unsaturated monomers may be used alone or in combination.

The polymer particles can be prepared by suspension polymerization, dispersion polymerization, precipitation polymerization, seeded polymerization, and soap-free emulsion polymerization. In the present invention, seeded polymerization can be used to prepare polymer particles having a uniform particle diameter distribution.

The seeded polymerization can be carried out as follows. First, polymer seed particles having a uniform particle diameter can be dispersed in an aqueous solution. An aqueous emulsion of a crosslinking polymerizable unsaturated monomer in which an oil-soluble initiator can be dissolved can be added to the dispersion. By this addition, the monomer can be absorbed inside the seed particles. Thereafter, the crosslinking polymerizable unsaturated monomer containing the seed particles can be polymerized to prepare polymer particles. Because the molecular weight of the polymer seed particles can greatly affect the phase separation and mechanical properties of the polymer particles prepared by the seeded polymerization, the molecular weight of the polymer seed can range from about 1,000 to about 30,000, for example, about 5,000 to about 20,000. In addition, the crosslinking polymerizable unsaturated monomer can be absorbed in an amount of about 10 to about 300 parts by weight, based on one part by weight of the polymer seed particles.

The initiator used to prepare the polymer particles can be a common oil-soluble radical initiator. Examples thereof can include peroxide-based compounds, e.g., benzoyl peroxide, lauryl peroxide, o-chlorobenzoyl peroxide, o-methoxybenzoyl peroxide, t-butylperoxy-2-ethylhexanoate, t-butyl peroxyisobutyrate, 1,1,3,3-tetramethylbutylperoxy-2-ethylhexanoate, dioctanoyl peroxide and didecanoyl peroxide, and azo compounds, e.g., 2,2'-azobisisobutyronitrile, 2,2'-azobis (2-methylbutyronitrile) and 2,2'-azobis(2,4-dimethylvaleronitrile), and the like and mixtures thereof. The initiator can be used in an amount of about 0.1 to about 20% by weight, based on the total weight of the monomers.

During polymerization of the polymer particles, if necessary, a surfactant and a dispersion stabilizer can be used to stabilize the latex. Examples of suitable surfactants can include common surfactants, such as anionic, cationic, and non-ionic surfactants, and mixtures thereof.

The dispersion stabilizer can be a material that can be dissolved or dispersed in polymerization media. Examples thereof can include water-soluble polymers, e.g., gelatin, starch, methylcellulose, ethylcellulose, hydroxyethylcellulose, carboxymethyl-cellulose, polyvinylpyrrolidone, polyvinyl alkyl ether, polyvinyl alcohol, polyacrylic acid, polyacrylamide, polyethylene oxide and sodium polymethacrylate, barium sulfate, calcium sulfate, calcium carbonate, calcium phosphate, aluminum sulfate, talc, clay, diatomaceous earth, and metal oxide powders, and the like. These materials may be used alone or in combination. The dispersion stabilizer can be used in an amount sufficient to inhibit the settlement of the polymer particles formed during polymerization due to gravity and aggregation of the particles. The dispersion stabilizer can be used in an amount of about 0.01 to about 15 parts by weight, based on 100 parts by weight of all the reactants.

The conductive particles 1 can be prepared by forming the metal layer 12 on the surface of the polymer particles 11. Examples of metals that can be used to form the metal layer 12 include, but are not limited to, nickel (Ni), gold (Au), silver (Ag), copper (Cu), platinum (Pt), palladium (Pd), cobalt (Co), tin (Sn), indium (In), indium tin oxide (ITO), and the like, multilayer composite metals containing one or more of these metals as main components. Exemplary conductive particles of the invention can include a double metal layer of nickel/ gold in which the surface of the polymer particles 11 is sequentially plated with nickel and gold. Another conductive metal, such as platinum (Pt) or silver (Ag), can be used instead of gold.

Examples of methods for forming the metal layer on the base particles include, but are not limited to, electroless plating, coating using metal powders, vacuum deposition, ion plating, and ion sputtering, and the like.

Conductive particles can be prepared using electroless plating via the following three steps: a first step for pretreating the surface of the base particles by defatting, etching, sensitizing, catalyzing, treating with a reducing agent, and the like; a second step including electroless nickel (Ni) plating and washing; and a third step including gold (Au) substitution plating.

Electroless plating can include the following specific procedure. First, the polymer particles can be dipped in a surfactant solution having a proper concentration to wash and defat the particle surface. Thereafter, etching can be performed using a mixed solution of chromic acid and sulfuric acid to form anchors on the surface of the base particles. The surface-treated base particles can be dipped in a solution of tin chloride and palladium chloride to catalyze and activate the particle surface. As a result, fine nuclei of the palladium catalyst can be formed on the surface of the base particles. Subsequently, a reduction reaction can be carried out using sodium hypophosphite, sodium borohydride, dimethyl amine borane, hydrazine, and the like, to form uniform palladium nuclei on the particles. The resulting base particles can be dispersed in an electroless nickel plating solution, after which the nickel salts can be reduced using sodium hypophosphite to form a nickel-plated layer on the base particles. The nickel-plated base particles can be added to an electroless gold plating solution having a certain concentration to induce a gold substitution plating reaction, thereby forming a gold-deposited layer on the outermost layer.

The conductive metal layer 12 of the conductive particles 1 according to the present invention can have a thickness of about 0.01 μm to 5 μm. When the thickness of the metal layer is less than about 0.01 μm, it can be difficult to attain the desired conductivity. On the other hand, when the thickness of the metal layer exceeds about 5 μm, the deformability, elasticity and recoverability of the particles may not be satisfactory due to the thick metal layer, and the particles tend to aggregate when used in electrode packaging materials, making it difficult to enhance conducting properties.

The present invention will now be described in more detail with reference to the following examples. However, these examples are given for the purpose of illustration only and are not to be construed as limiting the scope of the invention.

Example 1

(1) Preparation of Seed Particles 30 parts by weight of a styrene monomer, 6 parts by weight of 2,2'-azobis(2,4-dimethylvaleronitrile) as an initiator, 18.7 parts by weight of polyvinylpyrrolidone (molecular weight: 40,000), and 190 parts by weight of methanol and 15 parts by weight of ultrapure water as reaction media are mixed together, quantified, and added to a reactor. Thereafter, the reaction mixture is subjected to polymerization under a nitrogen atmosphere at 70° C. for 24 hours to prepare polystyrene seed particles. The seed particles are washed with ultrapure water and methanol several times, and dried in a vacuum freeze dryer to obtain a powder. The seed particles are measured to have an average particle diameter of 1.15 μm, a CV value of 4.1%, and a molecular weight of 15,500.

(2) Preparation and Evaluation of Polymer Resin-based Particles 2 parts by weight of the seed particles are homogeneously dispersed in 450 parts by weight of an aqueous sodium lauryl sulfate (SLS) solution (0.2 wt %). Separately, a monomer mixture consisting of 90 parts by weight of styrene and 10 parts by weight of divinylbenzene, wherein 1 parts by weight of benzoyl peroxide as an initiator are dissolved, are added to 300 parts by weight of an aqueous SLS solution (0.2 wt %). The resulting mixture is emulsified for 10 minutes using a homogenizer. The monomer emulsion is added to the seed dispersion to swell the monomers inside the seed particles at room temperature. After completion of the swelling, 500 parts by weight of an aqueous polyvinylalcohol solution (5 wt %) having a saponification degree of about 88% is added thereto. After the temperature of the reactor is raised to 80° C., polymerization is performed. The styrene-divinylbenzene copolymer resin particles thus prepared are washed with ultrapure water and ethanol several times, and dried in vacuo at room temperature. The K value and compression recovery factor of the conductive particles is measured, and the obtained results are shown in Table 1.

(3) Preparation and Evaluation of Conductive Particles

The polymer particles are etched in an aqueous sodium hydroxide solution, dipped in a palladium chloride solution, and reduced to form fine nuclei of the palladium on the surface of the base particles. Thereafter, electroless nickel plating and gold substitution plating are sequentially performed to obtain conductive particles in which a nickel/gold metal layer is formed on the base particles.

(4) Manufacture and Evaluation of Anisotropic Conductive Connection Structure 15 parts by weight of a bisphenol A epoxy resin having an epoxy equivalent of 6,000 and 7 parts by weight 2-methylimidazole as a curing agent are dissolved in a mixed solvent of toluene and methyl ethyl ketone, after which 10% by weight of the conductive particles and a silane-based coupling agent are dispersed in the solution. The resulting dispersion is coated on a PET release film, and dried to produce a 25 μm thick anisotropic conductive adhesive film.

An anisotropic conductive film is produced from the anisotropic conductive adhesive film so as to have the following dimensions. Height of bump electrodes: 40 μm, IC chip size: 6 mm×6 mm, thickness of BT resin substrate: 0.7 mm, thickness of wiring patterns formed on the substrate by copper and gold plating: 8 μm, pitch: 100 μm. The anisotropic conductive film is interposed between the IC chip and the substrate, and then pressurized to 3 MPa while heating at 180° C. for 10 seconds to manufacture an electrical connection structure.

To measure the electrical resistance between upper and lower electrodes of the connection sample, electrical resistance values between 20 adjacent upper and lower electrodes are measured, and averaged. Results are shown as connection resistance values in Table 1. Further, after the connection sample is aged at 85° C. and 85% RH for 1,000 hours, connection reliability is evaluated according to the increment in resistance as follows:

◎:≦0.1Ω, Δ:0.1Ω~0.3Ω, x:>0.3Ω

Example 2

Polymer particles and conductive particles are prepared in the same manner as in Example 1, except that a monomer mixture consisting of 80 parts by weight of styrene and 20 parts by weight of 1,4-butanediol diacrylate is used instead of the monomer mixture consisting of 90 parts by weight of styrene and 10 parts by weight of divinylbenzene. A connection structure is manufactured using the conductive particles. The properties of the base polymer particles and the connection structure are evaluated according to the same procedure as in Example 1. The results are shown in Table 1.

Example 3

Polymer particles and conductive particles are prepared in the same manner as in Example 1, except that a monomer mixture consisting of 80 parts by weight of styrene and 20 parts by weight of 1,6-hexanediol dimethacrylate is used instead of the monomer mixture consisting of 90 parts by weight of styrene and 10 parts by weight of divinylbenzene. A connection structure is manufactured using the conductive particles. The properties of the base polymer particles and the connection structure are evaluated according to the same procedure as in Example 1. The results are shown in Table 1.

Example 4

Polymer particles and conductive particles are prepared in the same manner as in Example 1, except that a monomer mixture consisting of 80 parts by weight of styrene and 20 parts by weight of ethyleneglycol dimethacrylate is used instead of the monomer mixture consisting of 90 parts by weight of styrene and 10 parts by weight of divinylbenzene. A connection structure is manufactured using the conductive particles. The properties of the base polymer particles and the connection structure are evaluated according to the same procedure as in Example 1. The results are shown in Table 1.

COMPARATIVE EXAMPLE 1

Polymer particles and conductive particles are prepared in the same manner as in Example 1, except that 100 parts by weight of divinylbenzene was used instead of the monomer mixture consisting of 90 parts by weight of styrene and 10 parts by weight of divinylbenzene. A connection structure is manufactured using the conductive particles. The properties of the base polymer particles and the connection structure are evaluated according to the same procedure as in Example 1. The results are shown in Table 1.

COMPARATIVE EXAMPLE 2

Polymer particles and conductive particles are prepared in the same manner as in Example 1, except that a monomer mixture consisting of 80 parts by weight of tetramethylolpropane tetraacrylate and 20 parts by weight of acrylonitrile are used instead of the monomer mixture consisting of 90 parts by weight of styrene and 10 parts by weight of divinylbenzene. A connection structure is manufactured using the conductive particles. The properties of the base polymer particles and the connection structure are evaluated according to the same procedure as in Example 1. The results are shown in Table 1.

TABLE 1

|  |  | Average particle diameter μm | CV Value % | K values | | | Compression recovery factor % | Compressive rupture deformation % | Anisotropic connection structure | |
|  |  |  |  | 10% K value | 20% K value Kgf/mm² | 30% K value |  |  | Connection resistance Ω | Connection reliability — |
| --- | --- | --- | --- | --- | --- | --- | --- | --- | --- | --- |
| Example No. | 1 | 4.5 | 3.9 | 381 | 214 | 180 | 11 | 64 | 0.7 | ◎ |
|  | 2 | 4.4 | 3.8 | 494 | 271 | 302 | 24 | 53 | 0.6 | ◎ |
|  | 3 | 4.4 | 4.0 | 426 | 224 | 190 | 19 | 51 | 0.7 | ◎ |
|  | 4 | 4.6 | 3.8 | 445 | 247 | 219 | 17 | 48 | 0.8 | ◎ |
| Comparative Example No. | 1 | 4.4 | 3.8 | 650 | 453 | 435 | 52 | 55 | 1.3 | X |
|  | 2 | 4.5 | 4.0 | 811 | 605 | 710 | 75 | 31 | 1.4 | X |

As can be seen from the data shown in Table 1, the conductive particles having appropriate deformability and recoverability prepared in Examples 1-4 and the anisotropic conductive adhesive films produced using the conductive particles show much lower connection resistance and better connection reliability than those having relatively low deformability and relatively high recoverability prepared in Comparative Examples 1 and 2 and the anisotropic conductive adhesive films produced using the conductive particles.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

That which is claimed is:

1. A polymer particle for anisotropic conductive packaging materials prepared by copolymerizing a styrene-based monomer, acrylonitrile, or a combination thereof with at least one crosslinking polymerizable monomer selected from the group consisting of divinylbenzene, 1,4-butanediol di(meth)acrylate, 1,6-hexanediol di(meth)acrylate, 1,9-nonanediol di(meth)acrylate, divinylsulfone, allyl compound, (poly)alkylene glycol di(meth)acrylate, pentaerythritol (meth)acrylate, methylolpropane (meth)acrylate, glycerol tri(meth)acrylate, and mixtures thereof, wherein said polymer particle has a K value at 10% particle diameter deformation (10% K value) of about 250 to about 700 kgf/mm², a compression recovery factor of less than 30%, and a compressive rupture deformation of about 30% or higher, wherein the polymer particle has a 20% K value (K value at 20% compressive deformation and a 30% K value (K value at 30% compressive deformation) not higher than about 70% of the 10% K value.

2. The polymer particle according to claim 1, wherein the polymer particle has a 10% K value of about 350 to about 600 kgf/mm².

3. The polymer particle according to claim 1, wherein the polymer particle has an average particle diameter of about 0.1 to about 200 μm.

4. The polymer particle according to claim 1, wherein the polymer particle has an aspect ratio lower than about 1.5 and a coefficient of variation (CV) not higher than about 20%.

5. The polymer particle of claim 1, wherein said allyl compound comprises at least one compound selected from the group consisting divinylbenzene, 1,4-butanediol di(meth)acrylate, 1,6-hexanediol di(meth)acrylate, 1,9-nonanediol di(meth)acrylate, allyl (meth)acrylate, divinylsulfone, diallyl phthalate, diallylacrylamide, triallyl (iso)cyanurate, triallyl trimellitate, and mixtures thereof.

6. The polymer particle of claim 1, wherein said (poly)alkylene glycol di(meth)acrylate comprises at least one compound selected from the group consisting of (poly)ethylene glycol di(meth)acrylate, (poly)propylene glycol di(meth)acrylate, and mixtures thereof.

7. The polymer particle of claim 1, wherein said pentaerythritol (meth)acrylate comprises at least one compound selected from the group consisting of pentaerythritol tetra(meth)acrylate, pentaerythritol tri(meth)acrylate, pentaerythritol di(meth)acrylate, dipentaerythritol hexa(meth)acrylate, dipentaerythritol penta(meth)acrylate, and mixtures thereof.

8. The polymer particle of claim 1, wherein said methylolpropane (meth)acrylate comprises at least one compound selected from the group consisting of trimethylolpropane tri(meth)acrylate, ditrimethylolpropane tetra(meth)acrylate, tetramethylolpropane tetra(meth)acrylate, and mixtures thereof.

9. The polymer particle according to claim 1, wherein the styrene-based monomer comprises at least one monomer selected from the group consisting of styrene, ethyl vinyl benzene, α-methyl styrene, m-chloromethyl styrene, and mixtures thereof.

10. The polymer particle according to claim 1, wherein the polymer particle is prepared by seeded polymerization using a polymer seed particle having a molecular weight of from about 1,000 to about 30,000.

11. The polymer particle according to claim 10, wherein the total content of the polymerizable monomer used in the seeded polymerization is about 10 to about 300 parts by weight, based on one part by weight of the polymer seed particle.

12. A conductive particle comprising the polymer particle according to claim 1, and at least one conductive metal layer formed on the surface of the polymer particle.

13. An anisotropic conductive packaging material comprising the conductive particle according to claim 12 comprising the polymer particle and at least one conductive metal layer formed on the surface of the polymer particle.

14. The polymer particle according to claim 1, having a compression recovery factor of 24% or less.

15. The polymer particle according to claim 1, comprising a polymer comprising of from 10 to 20 parts crosslinking polymerizable monomer and from 80 to 90 parts polymerizable unsaturated monomer.

* * * * *

UNITED STATES PATENT AND TRADEMARK OFFICE
CERTIFICATE OF CORRECTION

| | | |
|---|---|---|
| PATENT NO. | : 8,129,023 B2 | Page 1 of 1 |
| APPLICATION NO. | : 11/763521 | |
| DATED | : March 6, 2012 | |
| INVENTOR(S) | : Jung Bae Jun et al. | |

It is certified that error appears in the above-identified patent and that said Letters Patent is hereby corrected as shown below:

In the Claims:

Column 14, Line 9, Claim 15, reads "a polymer ~~comprising~~ of from 10 to 20 parts crosslinking" and should read "a polymer consisting of from 10 to 20 parts crosslinking"

Signed and Sealed this
Tenth Day of July, 2012

David J. Kappos
*Director of the United States Patent and Trademark Office*